United States Patent

Glaise

[15] 3,704,399

[45] Nov. 28, 1972

[54] SEMICONDUCTOR DEVICE AND CIRCUIT ARRANGEMENT COMPRISING THE DEVICE

[72] Inventor: Rene Glaise, Caen, France

[73] Assignee: U.S. Philips Corporation, New York, N.Y.

[22] Filed: April 15, 1971

[21] Appl. No.: 134,342

[30] Foreign Application Priority Data

April 17, 1970 France......................7013973

[52] U.S. Cl..........317/235 R, 317/235 T, 317/235 X, 317/235 Y, 307/302

[51] Int. Cl...............................................H01l 11/06

[58] Field of Search..........317/235 X, 235 Y, 234 Q; 307/302

[56] References Cited

UNITED STATES PATENTS 3,404,295 10/1968 Warner......................317/235

3,461,324 8/1969 Barry.........................317/235

3,614,555 10/1971 Glinski et al...............317/235

*Primary Examiner*—Jerry D. Craig

*Attorney*—Frank R. Trifari

[57] ABSTRACT

Semiconductor device comprising a semiconductor body having a base region of a first conductivity type and an emitter and collector region of a second conductivity type formed side by side in said base region and having like the latter contacts located on a face of said body, to which they are adjacent, characterized in that the device comprises at least one further region of the second conductivity type arranged near the collector and separated therefrom by the semiconductor material of the base region so that at a bias voltage at the collector-base junction exceeding a given threshold value the depletion zone of said junction attains said further region. The device has three stable states.

5 Claims, 4 Drawing Figures

INVENTOR.
RENÉ GLAISE
BY [signature]
AGENT

*INVENTOR.*
RENÉ GLAISE
*BY* [signature]
AGENT

SEMICONDUCTOR DEVICE AND CIRCUIT ARRANGEMENT COMPRISING THE DEVICE

This invention relates to a semiconductor device comprising a semiconductor body having at least one transistor comprising a base region adjacent one face of the body of a first conductivity type and a collector zone and an emitter zone of a second conductivity type also adjacent said one surface and being separated from each other by the base region. The invention also relates to a circuit arrangement comprising the device.

It is known that control— or switching systems comprising a transistor generally require for this transistor two operational states, which are as different from each other as possible one state of a high collector voltage and a low collector current, another state of low collector voltage and high collector current, which means a high impedance or cut-off state and a low impedance or conductive state. However, some uses of control— or switching systems, for example, ternary logical systems, require a number of operational states exceeding two.

Hitherto a given number of transistors each having a threshold voltage for operation differing from each other have been employed for this purpose. This has the disadvantage not only of multiplying the number of transistors but also of increasing the number of connections and, if the assembly is integrated, the device has larger dimensions and can be manufactured only with greater difficulty. Moreover, the increase in number of components raises accordingly the possibilities of disturbance or deterioration of the circuitry, so that its reliability is reduced.

It is furthermore known that it is desirable to have two-stage amplifying circuits available in the analogue circuit systems. The basic idea of this invention resides in that the depth of the depletion layer located on either side of the collector-base junction of a transistor biassed in the reverse direction varies with the value of the bias voltage.

According to the present invention a semiconductor device as set forth in the preamble is characterized in that at least one further region of the second conductivity type is provided, which is separated by the base region from the emitter and collector zones, the distance between said further region and the collector zone and the dopant concentration of the base region between the collector zone and the further region being so small that the depletion zone of the collector-base junction extends up to said further region at a given threshold voltage in the reverse direction across said junction.

Said further region of the same conductivity type as the collector zone is preferably buried beneath said collector and preferably also beneath the emitter and the base contact region.

The emitter, the collector and the base portion arranged between them form a low-gain lateral transistor. If an adequate voltage is applied to the emitter and if the value of the reverse bias voltage at the collector-base junction is lower than said threshold value, the operation of the device is reduced to that of said low gain lateral transistor. In this case only the lateral portion of the collector-base junction opposite the emitter is active.

On the other hand the emitter, the region of the same conductivity type as the collector zone and the base portion located between them form a high-gain transverse transistor. If an adequate voltage is applied to the emitter and if the value of the reverse bias voltage at the collector-base junction is higher than said threshold value, the base zone located between the collector and said further region is completely depleted and the buried region having a floating potential is brought approximately to the same potential as the collector and is electrically connected to the latter. Consequently, the device embodying the invention operates in this case as well as a lateral transistor and as a transverse transistor, so that it provides a high gain, since all charge carriers emanating from the emitter are captured by the collector, which is not the case when only the lateral transistor is operative.

As a consequence such a device determines two different characteristic curves in a diagram of the collector current $I_C$ as a function of the voltage $V_{CE}$ between the collector and the emitter with a constant base current $I_B$. These two curves correspond to two conductive states of different gain, the first conductive state being limited on the one hand by the zero value of the voltage and by the threshold voltage at which the gain passes from a low value to a high value and the second conductive state being limited on the other hand by the same threshold voltage and by the collector-emitter break-down voltage.

Therefore, the device according to the invention has three stable states: one cut-off state, one low-conducting state and one highly conductive state, which is particularly advantageous in given switching circuitry, for example, in memory devices or ternary logical systems.

A device comprising transistors embodying the invention permits of considerably reducing the number of components and connections and hence of reducing the volume and of increasing the reliability. If furthermore permits of obtaining an amplifying gate having two separate inputs without polarity inversion and two-stage amplifiers.

The further region of the same conductivity type as the collector zone is preferably formed by a buried layer between a substrate region of the one conductivity type and an epitaxial layer of the same conductivity type.

There may be provided a conductive path between this buried layer and the surface, but the buried layer may, as an alternative, be left deeply buried without any connection to a surface region so that, since the buried zone is at floating potential, the surface problems are avoided.

The region of the same conductivity type as the collector may also be arranged so as to extend to the face of the semiconductor body opposite the contacted surface.

The base contact may be arranged between the emitter contact and the collector contact. However, the emitter contact is preferably arranged between the collector contact and the base contact, which has the advantage of providing a thinner base region between the emitter and the collector of the lateral transistor.

Moreover, the collector may have substantially the shape of a ring surrounding the emitter and the base contact may be arranged outside said ring. In this way the lateral transistor has a current gain $\beta$ of about 1.

The emitter zone may be obtained by the diffusion of a high concentration of an impurity providing the opposite conductivity type from the active surface of the device.

In these various embodiments a transistor in accordance with the invention may be integrated in a monolithic assembly and be formed simultaneously with other active or passive elements of said assembly.

The following description given by way of non-limiting example with reference to the accompanying drawing will show how the invention may be carried into effect.

Figure 1:
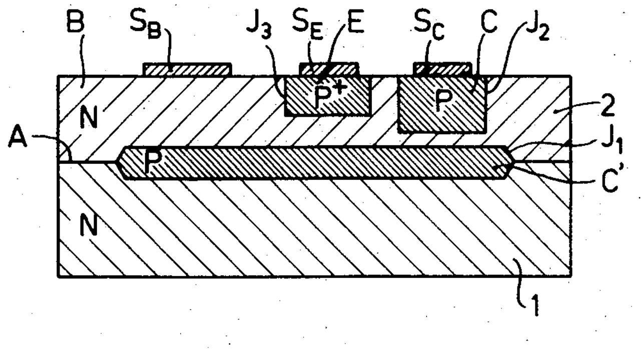
FIG. 1 is a schematic sectional view of a transistor embodying the invention.

It should be noted that the dimensions on the drawing are materially exaggerated and not to scale for the sake of clarity. The description of the operation of the device according to the invention is given with reference to a PNP-type transistor, but it will be obvious that the invention also relates to NPN-type transistors.

The transistor according to the invention shown in FIG. 1 comprises an N-type substrate having an epitaxial layer 2 also of N-type conductivity, between which a buried zone C′ or P-type conductivity is formed and separated from the layer 2 by a pn-junction $J_1$. The zone C′ is intended to play the part of a collector of the transverse transistor (in co-operation with the zone C, see below). In the epitaxial layer a deep island-shaped zone C of P-type conductivity is formed and separated from the layer 2 by a pn-junction $J_2$, which is intended to operate as the collector zone of the lateral transistor and a $P^+$-zone E is separated from the layer 2 by a pn-junction $J_3$ and operates as the emitter zone. The Figure shows the emitter zone E in the neighborhood of the collector zone C in order to obtain a comparatively high value of the current gain $\beta$ of the lateral transistor. In this transistor the base B is formed by the layer 2 and the base contact is indicated as $S_B$. The emitter and collector contacts are designated by $S_E$ and $S_C$ respectively.

Figure 2:
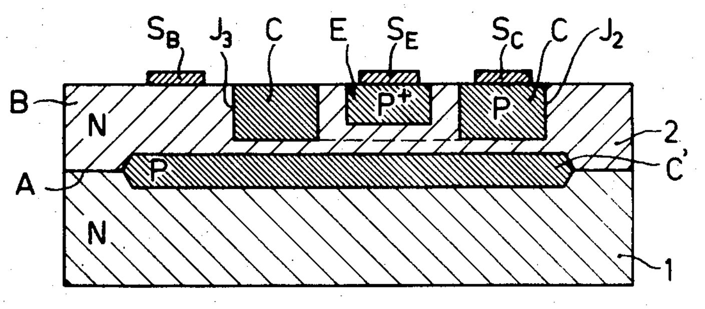
FIG. 2 is a schematic sectional view of a variant of the transistor embodying the invention.

The embodiment shown in FIG. 2 comprises the same elements designated by identical references. However, in this transistor the collector region C has the shape of a ring surrounding the emitter island E. In this way the lateral transistor can have an amplification factor $\beta$ of about 1.

In operation a reverse bias voltage is applied between the base B and the collector C of such a transistor via the contacts $S_B$ and $S_C$, whereas the emitter-base junction $J_3$ is biassed in the forward direction by means of a source connected to the contacts $S_E$ and $S_B$.

When the voltage applied between the contacts $S_C$ and $S_E$ is low, the depletion zone located on either side of the junction $J_2$ extends in the base, however, without attaining the junction $J_1$. In this case the charge carriers emanating from the emitter are captured only by the lateral portion of the junction $J_2$, the current gain being then low.

Figure 3:
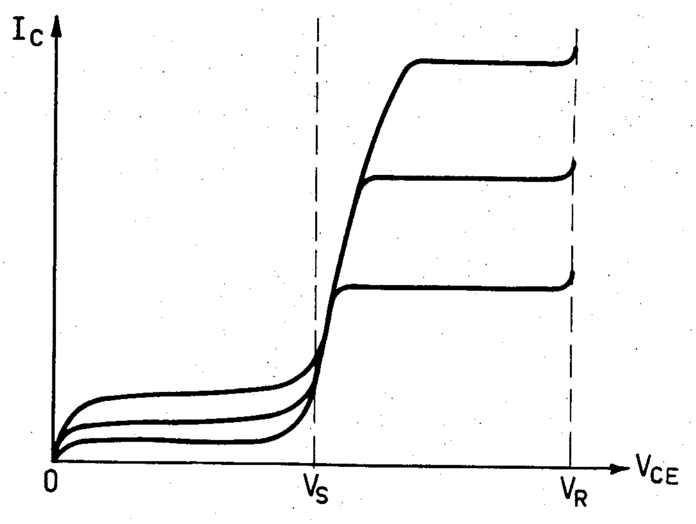
FIG. 3 illustrates a characteristic diagram of a transistor embodying the invention, which shows variations of the collector current as a function of the collector-emitter voltage, the base current being constant.

The variations of the collector current $I_C$ as a function of the voltage $V_{CE}$ between the collector and the emitter in this mode of operation correspond in FIG. 3 to the curves (each is drawn for a constant base current) on the left-hand side of the voltage $V_S$.

When the bias collector-base voltage $V_{CB}$ attain a value $V_S$, termed the threshold voltage, at which the depletion zone of the junction $J_2$ comes into contact with the junction $J_1$, the regions C′ and C are electrically interconnected. The surface of the collector-base junction thus becomes very large so that practically all charge carriers emanating from the emitter are captured, which results in a high gain as indicated in FIG. 3 by the curves on the right-hand side of the voltage $V_S$. This region is limited on the upper side only by the collector-emitter break-down voltage $V_R$.

The transistor according to the invention thus has two different conductive states (one on each side of the voltage $V_S$), which are perfectly stable and in addition to the cut-off state of the transistor increase materially the possibilities of use in switching arrangements.

Experience shows that when $V_{CE}$ is lower than $V_S$ the gain $\beta_1$ of the device is of the order of 1, whereas in accordance with the respective dimensions of the emitter and the collector, when $V_{CE}$ is higher than $V_S$, the gain $\beta_2$ may have a value varying between 10 and 100.

The transistor according to the invention may be manufactured by known semiconductor technology. In FIGS. 1 and 2 the oxide layers at the surface resulting from the various thermal treatments are not shown; reference has not been made to these protective layers because the formation of such layers and the provision of windows at the desired places are systematic operations preceding any diffusion operation carried out by known techniques.

Reference has neither been made to the operations of deposition prediffusion of the impurity to be diffused, since it may be assumed that the diffusion operations, if not specified to the contrary, are preceded by a prediffusion deposition.

On an N-type doped semiconductor substrate 1, for example, of silicon, having a resistivity of about 0.5 Ohm.cm a P-type island-shaped zone C′ is provided by local diffusion of boron. On the surface A of the substrate 1, including the zone C′, an N-type layer 2 is epitaxially grown to a thickness of 10 $\mu$m. From the external surface of said layer 2 local diffusion from one side provides a P-type boron-doped zone C and on the other side a $P^+$-type zone E. After the various thermal treatments the island C′ has its definite shape shown in FIGS. 1 and 2.

The thickness of the island E is of the order of 3 $\mu$m and that of the island C is of the order of 4 $\mu$m. Taking into account the out-diffusion of the layer C′, the distance between the two regions of the collector C and C′ may be estimated at 1 $\mu$m.

The contact zones $S_E$, $S_B$ and $S_C$, arranged on the emitter, the base and the collector respectively at the surface, are obtained by conventional metallizing methods.

If the transistor embodying the invention has to be integrated, it is desirable to provide insulating partitions. In this case for instance double epitaxial growth may be carried out on a substrate of a conductivity type opposite that of the epitaxial layers so that in said layers insulating islands can be obtained by methods well known to those skilled in the art. The buried collector layer is then formed between the two epitaxial layers.

The other operations, for example, the provision of the emitter and the various collector regions, are identical to those described above, but they may be partially carried out simultaneously with the provision of the insulating partitions.

Figure 4:
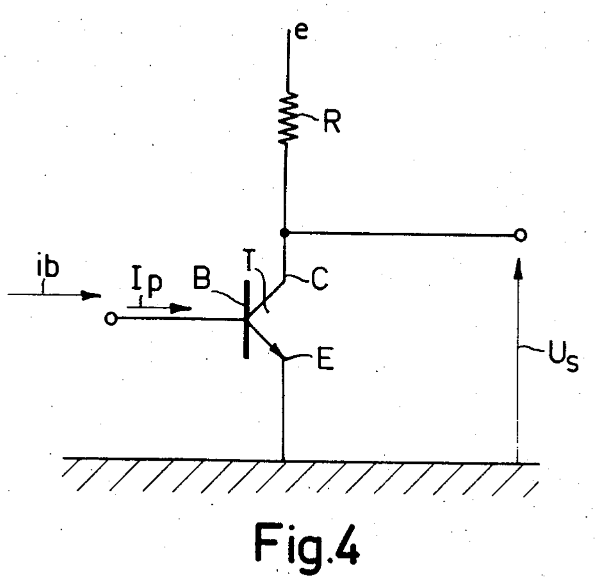
FIG. 4 illustrates the diagram of an amplifying circuit comprising a transistor embodying the invention.

FIG. 4 shows an amplifying circuit arrangement comprising a transistor T according to the invention, the collector circuit C of which includes a resistor R connected to a supply voltage *e*. The emitter E is connected to earth, the signal to be amplified *ib* is applied to the base B and the output voltage Us, the A.C. component of which is designated by *us*, is derived between the collector and earth.

To the base B a fixed current Ip is applied. If *ic* is the A.C. component of the collector currents we have:

us = Ric = Rib $\beta$, irrespective of the value of $\beta$.

If the collector voltage $V_B$ is lower than the threshold voltage $V_S$, the value $\beta_1$ or $\beta$ is low, whereas if the collector voltage $V_B$ is higher than the threshold voltage $V_S$, the value $\beta_2$ of $\beta$ is high. Consequently, two amplifying states are available and controllable at will.

The device thus has three stable states, one without gain, a second with low gain and the third with high gain. It should be noted that with two amplifying states the polarity of the collector is the same and that it is easy to change over from one state to the other.

This device may also serve as an amplifying gate or as a gate having two separate inputs, which has hitherto required several transistors and which is now obtained by a single transistor in accordance with the invention.

It should be noted that this transistor, the manufacture of which is compatible with the planar technique, can be readily integrated in monolithic assemblies. Furthermore within the scope of the invention other geometries may be used, all conductivity types may be substituted by the opposite types, and other semiconductor materials may be used.

What is claimed is:

1. A semiconductor device comprising a semiconductor body containing at least one transistor, said transistor comprising a surface base region of a first conductivity type adjacent a major surface of the body, and surface collector and emitter zones of a second conductivity type also adjacent said major surface and being separated from each other by the said base region, at least one further region of the second conductivity type in the body and separated by the base region from the emitter and collector zones, means for applying a potential to the collector zone for reverse biasing the junction between it and the base region thereby establishing a depletion zone which extends from the collector-base junction into the base region towards both the emitter zone and said further region, the spacing between the collector zone and the said further region and the emitter zone and the dopant concentration of the base region extending therebetween being such that at a given threshold value of the said reverse potential the depletion zone reaches-through to the said further region before it reaches-through to the emitter zone, said further region having a portion extending beneath the collector zone and beneath the emitter zone, whereby below the threshold potential value the transistor operates as a lateral transistor of relatively low gain and above the threshold potential value the transistor operates as a transverse transistor of relatively high gain.

2. A semiconductor device as claimed in claim 1 wherein the collector zone has an annular shape and substantially surrounds the emitter zone.

3. A semiconductor device as claimed in claim 1 wherein the said further zone is a buried layer which is spaced from the said major surface.

4. A semiconductor device as set forth in claim 3 wherein the collector zone extends to a greater depth in the body than the emitter zone.

5. A circuit arrangement comprising a semiconductor device as claimed in claim 1 and further including means for maintaining the emitter zone at a constant potential, means for applying a voltage to the collector zone alternating below and above said threshold potential, means for introducing a signal to the base region, and means for deriving a signal from the collector zone.

* * * * *